United States Patent
Romero et al.

(10) Patent No.: US 10,481,219 B2
(45) Date of Patent: *Nov. 19, 2019

(54) MAGNETIC FIELD SENSOR WITH FEEDBACK LOOP FOR TEST SIGNAL PROCESSING

(71) Applicant: Allegro MicroSystems, LLC, Manchester, NH (US)

(72) Inventors: Hernán D. Romero, Buenos Aires (AR); Octavio H. Alpago, Buenos Aires (AR)

(73) Assignee: Allegro MicroSystems, LLC, Manchester, NH (US)

( * ) Notice: Subject to any disclaimer, the term of this patent is extended or adjusted under 35 U.S.C. 154(b) by 72 days.

This patent is subject to a terminal disclaimer.

(21) Appl. No.: 15/897,708

(22) Filed: Feb. 15, 2018

(65) Prior Publication Data

US 2019/0079146 A1    Mar. 14, 2019

Related U.S. Application Data

(63) Continuation-in-part of application No. 15/700,603, filed on Sep. 11, 2017.

(51) Int. Cl.
*G01R 33/07* (2006.01)
*H03F 3/45* (2006.01)
(Continued)

(52) U.S. Cl.
CPC ............ *G01R 33/075* (2013.01); *H01L 43/04* (2013.01); *H03F 1/26* (2013.01); *H03F 3/387* (2013.01);
(Continued)

(58) Field of Classification Search
CPC ............. G01R 33/075; G01R 33/0041; G01R 33/0029; H03F 3/387; H03F 3/45475;
(Continued)

(56) References Cited

U.S. PATENT DOCUMENTS 5,619,137 A    4/1997  Vig et al.
5,621,319 A    4/1997  Bilotti et al.
(Continued)

OTHER PUBLICATIONS

"Amplitude Modulation with Square-Waves"; by Professor Bernd-Peter Paris; dated Mar. 3, 1998; downloaded from www.spec.gmu.edu on Mar. 9, 2017; 1 page.
(Continued)

*Primary Examiner* — Patrick Assouad
*Assistant Examiner* — Haidong Zhang
(74) *Attorney, Agent, or Firm* — Daly, Crowley, Mofford & Durkee, LLP (57) ABSTRACT

A sensor circuit may include one or more feedback loops to process and attenuate ripple and/or a test signal. The sensor circuit may comprise at least one magnetic field sensing element to generate a magnetic field signal representing a magnetic field to be measured, a test signal generator circuit configured to generate a test signal and combine the test signal with the magnetic field signal to generate a combined signal, and a signal path for processing the combined signal. The signal path may comprise an amplifier circuit to amplify the combined signal, an analog-to-digital converter (ADC) to convert the combined signal to a digital combined signal, and a feedback circuitry coupled to receive the digital combined signal and extract the test signal. A test comparator circuit compares the extracted test signal to a reference signal.

23 Claims, 9 Drawing Sheets

(51) Int. Cl.
H03F 1/26 (2006.01)
H01L 43/04 (2006.01)
H03F 3/387 (2006.01)
H03M 1/00 (2006.01)

(52) U.S. Cl.
CPC ..... *H03F 3/45475* (2013.01); *H03F 3/45977* (2013.01); *H03M 1/00* (2013.01); *H03F 2200/331* (2013.01); *H03F 2200/408* (2013.01); *H03F 2203/45528* (2013.01)

(58) Field of Classification Search
CPC .. H03F 3/45977; H03F 1/26; H03F 2200/408; H03F 2200/331; H03F 2203/45528; H03F 3/38; H03M 1/00; H03M 3/458; H01L 43/04; G01D 3/036; H03G 1/04; H03H 17/025; H03H 17/0219
See application file for complete search history.

(56) References Cited

U.S. PATENT DOCUMENTS

| | | | |
|---|---|---|---|
| 6,154,027 | A | 11/2000 | Alexander et al. |
| 6,522,131 | B1* | 2/2003 | Hiligsmann ............. G01D 3/02 324/174 |
| 7,292,095 | B2 | 11/2007 | Burt et al. |
| 7,605,647 | B1 | 10/2009 | Romero et al. |
| 7,764,118 | B2 | 7/2010 | Kusuda et al. |
| 7,800,389 | B2 | 9/2010 | Friedrich et al. |
| 7,990,209 | B2 | 8/2011 | Romero |
| 8,447,556 | B2 | 5/2013 | Friedrich et al. |
| 8,542,010 | B2 | 9/2013 | Cesaretti et al. |
| 8,559,554 | B2 | 10/2013 | Vossiek et al. |
| 8,680,846 | B2 | 3/2014 | Cesaretti et al. |
| 8,917,195 | B2* | 12/2014 | Motz ....................... H03M 1/02 341/110 |
| 9,201,122 | B2 | 12/2015 | Cesaretti et al. |
| 9,645,220 | B2 | 5/2017 | Cesaretti et al. |
| 9,817,083 | B2 | 11/2017 | Romero |
| 2003/0102909 | A1 | 6/2003 | Motz |
| 2003/0225539 | A1 | 12/2003 | Motz et al. |
| 2006/0202692 | A1* | 9/2006 | Tatschl .................... G01L 25/00 324/252 |
| 2007/0114988 | A1 | 5/2007 | Rossmann et al. |
| 2007/0247141 | A1* | 10/2007 | Pastre ................ G01R 33/0035 324/202 |
| 2008/0094055 | A1* | 4/2008 | Monreal .................. G01D 3/02 324/117 H |
| 2010/0321105 | A1 | 12/2010 | Romero |
| 2011/0018533 | A1 | 1/2011 | Cesaretti et al. |
| 2011/0215955 | A1 | 9/2011 | Motz et al. |
| 2014/0077873 | A1* | 3/2014 | Motz ....................... H03F 3/387 330/9 |
| 2016/0294331 | A1 | 10/2016 | Ivanov |
| 2016/0370440 | A1 | 12/2016 | Okatake et al. |
| 2019/0079143 | A1 | 3/2019 | Romero |
| 2019/0113584 | A1 | 4/2019 | Cook et al. |

OTHER PUBLICATIONS

"Amplitude Modulation"; downloaded from https://en.wikipedia.org/wiki/Amplitude_modulation on Mar. 9, 2017; 11 pages.
"Communication Systems/Amplitude Modulation;" downloaded from https://en.wikibooks.org/wiki/Communication_Systems/Amplitude_Modulation on Mar. 9, 2017; 14 pages.
"FFT Fundamentals (Sound and Vibration Measurement Suite)"; Nov. 2008 edition; downloaded from http://zone.ni.com on Jul. 1, 2016; 4 pages.
"Frequency Domain"; downloaded from https://en.wikipedia.org/wiki/Frequency_domain on Mar. 9, 2017; 3 pages.
"Johnson-Nyquist noise"; downloaded from https://en.wikipedia.org/wiki/Johnson-Nyquist_noise on Mar. 9, 2017; 7 pages.
"Quantization (signal processing)"; downloaded from https://en.wikipedia.org/wiki/Quantization_(singal_processing) on Mar. 9, 2017; 13 Pages.
"Spectral Analysis of Signals", by Petre Stoica and Randolph Moses; 2005 edition Chapter 4; 65 pages.
"Spectral Density"; downloaded from https://en.wikipedia.org/wiki/Spectral_density on Mar. 9, 2017; 9 pages.
"Spectral Lines", downloaded from http://www.cv.nrao.edu on Jul. 1, 2016; 10 pages.
"Speech Acoustics: Spectral Analysis of Sound"; by Robert Mannell; downloaded from http://clas.mg.edu.au/speech/acoustics/frequency/spectral.html on Jul. 1, 2016; 10 pages.
Bryant, James; "Multipliers vs. Modulators"; Analog Dialogue 47-06; Jun. 1, 2013; 2 pages.
Patent Database Search Results: ACLM/"Spectral Line" in US Patent Collection; downloaded from http://patft.uspto.gov on Jul. 1, 2016; 3 pages.
Smith; "Chapter 9: Applications of the DFT/Spectral Analysis of Signals;" The Scientist and Engineer's Guide to Digital Signal Processing, Spectral Analysis Signals; Jan. 1, 1997; 11 pages.
Wu et al.; "A Chopper Current-Feedback Instrumentation Amplifier with a 1mHz 1/f Noise Corner and an AC-Coupled Ripple-Reduction Loop;" 2009 IEEE International Solid-State Circuits Conference; ISSCC 2009/Session 19/Analog Techniques/19.1; Feb. 2009; 3 pages.
Restriction Requirement dated Jul. 10, 2014 for U.S. Appl. No. 13/542,103, 5 pages.
Response to Restriction Requirement dated Jul. 10, 2014 for U.S. Appl. No. 13/542,103; Response Filed Sep. 29, 2014; 1 page.
Office Action dated Jul. 6, 2015 for U.S. Appl. No. 13/542,103, 36 pages.
Response to Office Action dated Jul. 6, 2015 for U.S. Appl. No. 13/542,103; Response filed Nov. 17, 2015; 21 pages.
Final Office Action dated Mar. 23, 2016 for U.S. Appl. No. 13/542,103, 30 pages.
Response to Final Office Action dated Mar. 23, 2016 for U.S. Appl. No. 13/542,103; Resposne filed Jun. 17, 2016; 24 pages.
Office Action dated Jun. 30, 2016 for U.S. Appl. No. 13/542,103, 34 pages.
Response to Office Action dated Jun. 30, 2016 for U.S. Appl. No. 13/542,103; Response filed Sep. 21, 2016; 24 pages.
Final Office Action dated Dec. 30, 2016 for U.S. Appl. No. 13/542,103, 10 pages.
Response to Final Office Action dated Dec. 30, 2016 for U.S. Appl. No. 13/542,103; Response filed Mar. 23, 2017; 12 pages.
Notice of Allowance dated Jun. 27, 2017 for U.S. Appl. No. 13/542,103, 10 pages.
"Quantization (signal processing)"; downloaded from https://en.wikipedia.org/wiki/Quantization_(signal_processing) on Mar. 9, 2017; 13 pages.
"FFT Fundamentals (Sound and Vibration Measurement Suite)"; Nov. 2008 edition; downloaded from http://zone.nl.com on Jul. 1, 2016; 4 pages.
Response to Restriction Requirement dated Sep. 29, 2014 for U.S. Appl. No. 13/542,103, 1 page.
Response to Office Action dated Nov. 17, 2015 for U.S. Appl. No. 13/542,103, 21 pages.
Response to Final Office Action dated Jun. 17, 2016 for U.S. Appl. No. 13/542,103, 24 pages.
Response to Office Action dated Sep. 21, 2016 for U.S. Appl. No. 13/542,103, 24 pages.
Response to Final Office Action dated Mar. 23, 2017 for U.S. Appl. No. 13/542,103, 12 pages.
Notice of Allowance dated Jun. 27, 2017 for U.S. Appl. No. 13/542,103, 11 pages.
Preliminary Amendment filed on Mar. 13, 2019 for U.S. Appl. No. 15/700,603; 8 Pages.
U.S. Appl. No. 16/372,603, filed Apr. 2, 2019 of Hernán D. Romero, et al.; 76 pages.
Office Action dated Jul. 5, 2019 for U.S. Appl. No. 15/700,603, filed Sep. 11, 2017, 14 pages.

* cited by examiner

MAGNETIC FIELD SENSOR WITH FEEDBACK LOOP FOR TEST SIGNAL PROCESSING

CROSS REFERENCE TO RELATED APPLICATIONS

This is a CONTINUATION-IN-PART application of U.S. patent application Ser. No. 15/700,603 (filed Sep. 11, 2017), which is incorporated here by reference in its entirety.

FIELD OF THE INVENTION

This invention relates generally to magnetic field sensors and, more particularly, to a magnetic field sensor having a Hall element and electronics to reduce ripple generated by chopping or other signals.

BACKGROUND

There are a variety of types of magnetic field sensing elements, including, but not limited to, Hall Effect elements, magnetoresistance elements, and magnetotransistors. Different types of Hall Effect elements include planar Hall elements, vertical Hall elements, and circular Hall elements. There are also different types of magnetoresistance elements including, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Hall effect elements generate an output voltage proportional to a magnetic field. In contrast, magnetoresistance elements change resistance in proportion to a magnetic field. In a circuit, an electrical current can be directed through the magnetoresistance element, thereby generating a voltage output signal proportional to the magnetic field.

Magnetic field sensors, which use magnetic field sensing elements, are used in a variety of applications, including, but not limited to, current sensors that sense magnetic fields generated by currents in a conductor, magnetic switches, proximity detectors that sense the proximity of ferromagnetic or magnetic objects, rotation detectors that sense passing ferromagnetic articles such as gear teeth, and magnetic field density sensors.

Hall Effect elements exhibit an undesirable DC offset voltage. Techniques have been developed to reduce the DC offset voltage, while still allowing the Hall Effect element to sense a DC magnetic field. One such technique is commonly referred to as "chopping" or "current spinning" and entails driving a Hall Effect element in two or more different directions and receiving output signals at different output terminals as the Hall Effect element is differently driven. In this way, selected drive and signal contact pairs are interchanged during each phase of the chopping and offset voltages of the different driving arrangements tend to cancel toward zero.

Chopping is also applied to amplifiers to reduce an offset component and low frequency noise (i.e., flicker noise) of signals applied to the amplifier. Amplifiers implementing chopping are often referred to as chopper-stabilized amplifiers.

Chopping tends to generate undesirable spectral components (i.e., frequency components) and ripple in the resulting signal, which can be removed with filters. While conventional arrangements that use filters can effectively reduce the ripple, it will be understood that the filters tend to reduce a bandwidth or a response time of the magnetic field sensor.

Some applications require circuits to perform self-tests. For example, to adhere to automotive safety standards, circuits may be required to test themselves periodically and/or during operating to ensure the circuits are operating correctly. Processing a test signal may increase bandwidth requirements of certain circuits. It may be desirable for a circuit, such as a magnetic field sensor, to process a test signal while it also processes a signal representing the sensed magnetic field. However, processing multiple signals with different frequency components may require circuit components with greater bandwidth. For example, an amplifier that processes a test signal as well as other signals may require greater bandwidth or risk saturation. This can increase cost and area.

SUMMARY

A sensor circuit may include one or more feedback loops to process and attenuate ripple and/or a test signal. In an embodiment, a sensor circuit comprises at least one magnetic field sensing element to generate a magnetic field signal representing a magnetic field to be measured, a test signal generator circuit configured to generate a test signal and combine the test signal with the magnetic field signal to generate a combined signal, and a signal path for processing the combined signal. The signal path comprises an amplifier circuit to amplify the combined signal and an analog-to-digital converter (ADC) to convert the combined signal to a digital combined signal. A feedback circuit is coupled to receive the digital combined signal and extract the test signal. A test comparator circuit compares the extracted test signal to a reference signal.

In another embodiment, a sensor circuit comprises at least one magnetic field sensing element to generate a magnetic field signal representing a magnetic field to be measured, a test signal generator configured to generate a test signal and combine the test signal with the magnetic field signal to generate a combined signal and means for extracting the test signal from the combined signal and comparing the extracted test signal to a reference signal.

DESCRIPTION OF THE DRAWINGS

The foregoing features may be more fully understood from the following description of the drawings. The drawings aid in explaining and understanding the disclosed technology. Since it is often impractical or impossible to illustrate and describe every possible embodiment, the provided figures depict one or more illustrative embodiments. Accordingly, the figures are not intended to limit the scope of the broad concepts, systems and techniques described herein. Like numbers in the figures denote like elements.

DETAILED DESCRIPTION

Before describing the present invention, some introductory concepts and terminology are explained. The term "magnetic field sensing element" is used to describe a variety of types of electronic elements that can sense a magnetic field. The magnetic field sensing elements can be, but are not limited to, Hall Effect elements, magnetoresistance elements, or magnetotransistors. There are different types of Hall Effect elements, for example, planar Hall elements, vertical Hall elements, and circular vertical Hall (CVH) elements. There are also different types of magnetoresistance elements including, for example, anisotropic magnetoresistance (AMR) elements, giant magnetoresistance (GMR) elements, tunneling magnetoresistance (TMR) elements, Indium antimonide (InSb) elements, and magnetic tunnel junction (MTJ) elements.

Some magnetic field sensing elements have an axis of maximum sensitivity parallel to a substrate that supports the magnetic field sensing element, and others have an axis of maximum sensitivity perpendicular to a substrate. Most, but not all, magnetoresistance elements tend to have axes of maximum sensitivity parallel to the substrate and most, but not all, Hall elements tend to have axes of sensitivity perpendicular to a substrate.

The term "magnetic field sensor" is used to describe a circuit that includes a magnetic field sensing element. Magnetic field sensors are used in a variety of applications, including, but not limited to, current sensors that sense magnetic fields generated by currents in a conductor, magnetic switches, proximity detectors that sense the proximity of ferromagnetic or magnetic objects, rotation detectors that sense passing ferromagnetic articles such as gear teeth, and magnetic field density sensors.

The term "magnetic field signal" is used to describe any circuit signal that results from a magnetic field experienced by a magnetic field sensing element.

While circuits are described below that use Hall elements in chopped arrangements and that have certain circuits to reduce undesirable spectral components resulting from the chopping, similar techniques can be used with other magnetic field sensors that support N-phase chopping, in order to reduce undesirable spectral components no matter what their source.

Figure 1:
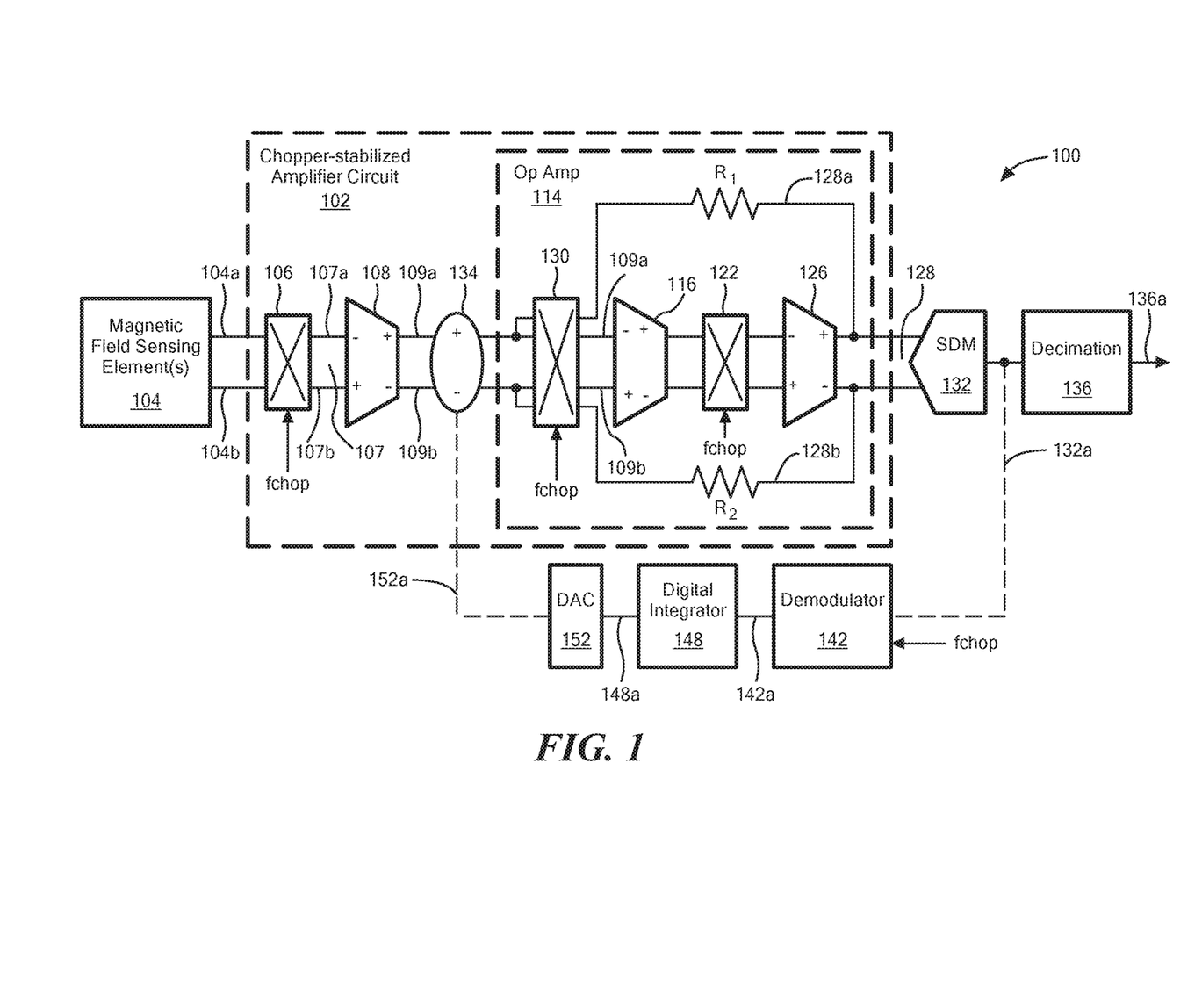
FIG. 1 is a block diagram of an example of a circuit to reduce ripple from chopper stabilization.

Referring to FIG. 1, a sensor 100, including circuits and techniques to reduce a ripple component of a signal generated by chopper stabilization, includes a chopper-stabilized amplifier circuit 102 responsive to one or more signals from a magnetic field sensing element 104, a sigma-delta modulator (SDM) 132 coupled to the chopper-stabilized amplifier circuit 102, and a decimation circuit 136 coupled to SDM 132. Sensor 100 also includes a feedback loop, or ripple reduction loop (RRL) that includes a demodulator 142 coupled to an output of the SDM 132, a digital integrator 148 coupled to the demodulator 142, and a digital-to-analog converter (DAC) 152 coupled to an output of the digital integrator 148 and to the chopper-stabilized amplifier 102.

With this configuration in which the ripple reduction loop includes the amplifier 102 and the SDM 132, a notch is provided in the signal transfer function of the SDM 132. In general, the notch may be provided in the forward signal path of the feedback loop of sensor 100. More particularly, the notch is provided by demodulating the output of the SDM with demodulator 142 and digitally integrating the result with digital integrator 148. Demodulating can be achieved by inverting the bit stream 132a according to the chopping frequency, Fchop. This avoids analog demodulation issues associated to parasitic capacitances and loading effects.

Integration by integrator 148 in the digital domain can be more desirable than conventional arrangements in which analog integration is performed, since analog integrators tend to require large capacitors for achieving large time constants and thus, tend to be costly in terms of area and other errors (like parasitic capacitance in chopper switches) which errors can adversely impact performance of the loop. As a result, the integrated signal 148a generated by the integrator 148 can be held as long as necessary without need of constant refresh. For example, in some embodiments, the feedback loop does not need to be active all the time and can be activated from time to time only (e.g., the feedback loop can be activated only if a certain delta temperature occurs which might generate some offset (and therefore) ripple drift).

The digital compensation signal 148a at the output of integrator 148 is representative of the chopped offset, which chopped offset is converted back to the analog domain by DAC 152 and subtracted from the chopped magnetic field signal by a summation element 134 in the amplifier circuit 102.

In the illustrated example, the converted compensation signal 152a is subtracted from the main path in the form of a current. Accordingly, a current steering DAC 152 can be used. In an embodiment, a ripple reduction factor of 100× (which is sufficient to maximize the input dynamic range of the SDM 132) requires no more than 7-bit precision in the DAC 152.

In this way, the ripple will tend to vanish over a few chopper clock cycles and therefore the SDM 132 will have virtually all of its input dynamic range available to digitize the sensed magnetic field signal (i.e., as opposed to having to process both the sensed signal and chopper generated ripple, which reduces the available input dynamic range) and saturation of the SDM will be avoided by removing ripple before the SDM (i.e., as opposed to relying on the decimation filter 136 to remove the ripple).

The chopper-stabilized amplifier 102 includes a switch, or modulator 106 that modulates a signal 104a, 104b received from a transducer 104 at a chopping frequency Fchop, an amplifier 108 that receives a modulated signal 107a, 107b from the switch 106, and an op amp 114 that receives the output from the amplifier 108. An output signal of the op amp 114 is an output signal 128 of the chopper-stabilized amplifier circuit 102.

More particularly, the sensor 100 includes a magnetic field sensing element 104 here, in the form of a Hall Effect element, that provides positive and negative Hall plate signals 104a, 104b to an N-Phase modulator circuit 106. Chopping of the Hall plate signals by the modulator 106 results in the signal 107a, 107b (that corresponds to the magnetic field sensed by the Hall Effect element 104) being shifted to a frequency related to the chopping frequency. While the Hall Effect element 104 and modulator 106 are intended to illustrate a generalized N-phase chopping arrangement. An example chopping circuit is shown and described in detail in connection with a U.S. Patent Publication No. 2014/0009144, filed on Jul. 5, 2012, entitled "Magnetic Field Sensors and Associated Methods for Removing Undesirable Spectral Components" and assigned to the Assignee of the subject application.

Amplifier 108 can be coupled to receive the differential signal 107a, 107b and configured to generate an amplified differential output signal 109a, 109b. In some embodiments, the amplifier 108 is a transconductance amplifier.

Summation element 134 can be coupled to receive the differential signal 109a, 109b and the analog compensation signal 152a from the DAC 152. Summation element 134 is configured to provide a differential signal to op amp 114.

In one example, the op amp (operational amplifier) 114 is a two-stage amplifier that includes an amplifier 116, a switch 122 coupled to an output of the amplifier 116, and an amplifier 126 coupled to the switch 122 to receive a modulated signal from the switch 122. While the switch 106 modulates a signal, the switch 122 demodulates a signal at the chopping frequency Fchop. That is, the switch 122 is used to recover the signal modulated by the switch 106. In this example, an output of the amplifier 126 is the output of the op amp 114 (i.e., the output signal 128 of the chopper-stabilized amplifier circuit 102).

In order to keep the op amp 114 in negative feedback (i.e., averting a positive feedback behavior) because of the behavior of the switch 122, a further switch 130 is provided in the op amp 114 to receive current signals from the output of the amplifier 126 (i.e., feedback from the op amp 114). To achieve this, the sign inversion in the feedback loop created by switch 122 has to be synchronously compensated for by switch 130. Therefore switch 130 is forced to operate at the exact same frequency as switch 122 and have the same clock phase. Since switch 130 is not in series with the op amp's input signal (summing circuit 134's outputs) it is then not chopping such signal. However please note switch 130 chops the amplified version of such input signal; that is the output of op amp 114. Such amplified version of the signal is chopped and fed back to the amplifier's input, such chopped fed back signal being the error signal that the negative feedback of the op amp is in charge of setting at the op amp's inputs, as any negative feedback circuit is expected to act.

Amplifiers 108, 116, and 126 can be transconductance amplifiers or other types of amplifiers such as voltage amplifiers.

The output signal 128 of the chopper-stabilized amplifier circuit 102 is coupled to the SDM 132 which digitizes the signal 128. Decimation filter 136 is coupled to an output of the SDM 132 to filter the output signal. In embodiments, the decimation filter 136 has a notch at a frequency selected to further reduce the ripple. In order to achieve the notch characteristics, the decimation rate needs to be set at a minimum value dictated by fclk/Fchop, where fclk is the clock frequency driving the SDM block. Lower rates than that one would not provide the desired notch characteristics. In other embodiments, decimation filter 136 does not reduce the ripple. Rather, the feedback loop portion of the signal path reduces the ripple.

An output signal 136a of the decimation filter 136 can correspond to an output signal of the magnetic field sensor 100 and can be coupled to a processor (not shown) for further processing depending on the sensor application. Accordingly, it is desirable that the sensor output signal 136a consist only of signal components directly related to the magnetic field which the Hall Effect element 104 senses and not include undesirable signal components including ripple.

As explained above, a feedback loop including demodulator 142, integrator 148, and DAC 152 is configured to reduce the ripple caused by the chopping modulator 106. More particularly, the output signal 132a of the SDM 132 is demodulated by demodulator 142, as may be achieved by inverting the bit stream 132a according to the Fchop rate.

The demodulated signal 142a is integrated by digital integrator 148 to generate a digital compensation signal 148a, which signal 148a is representative of the chopped offset. The digital compensation signal 148a is coupled to DAC 152 for conversion to an analog compensation signal 152a, which signal 152a is subtracted from the chopped magnetic field signal 109a, 109b to provide an input signal to the op amp 114.

While the illustrated DAC 152 is described as a current steering DAC configured to generate a current signal 152a for subtraction from the main signal path, it will be appreciated that other types of DACs are possible.

In general, the feedback loop portion of sensor 100 may effectuate a closed loop transfer function that acts as a notch filter. The feedback loop includes integrator 148, which may act as a high-gain low-pass filter. Because integrator 148 is part of the feedback loop, its transfer function may be inverted so that it acts as a high-pass filter. Demodulator 142 may shift the low-frequency response of integrator 148 to the frequency Fchop. This may result in the feedback loop providing sensor 100 with a transfer function that includes an inverted notch (i.e. a notch filter) that attenuates the test signal from the main signal path after a few clock cycles.

Figure 2:
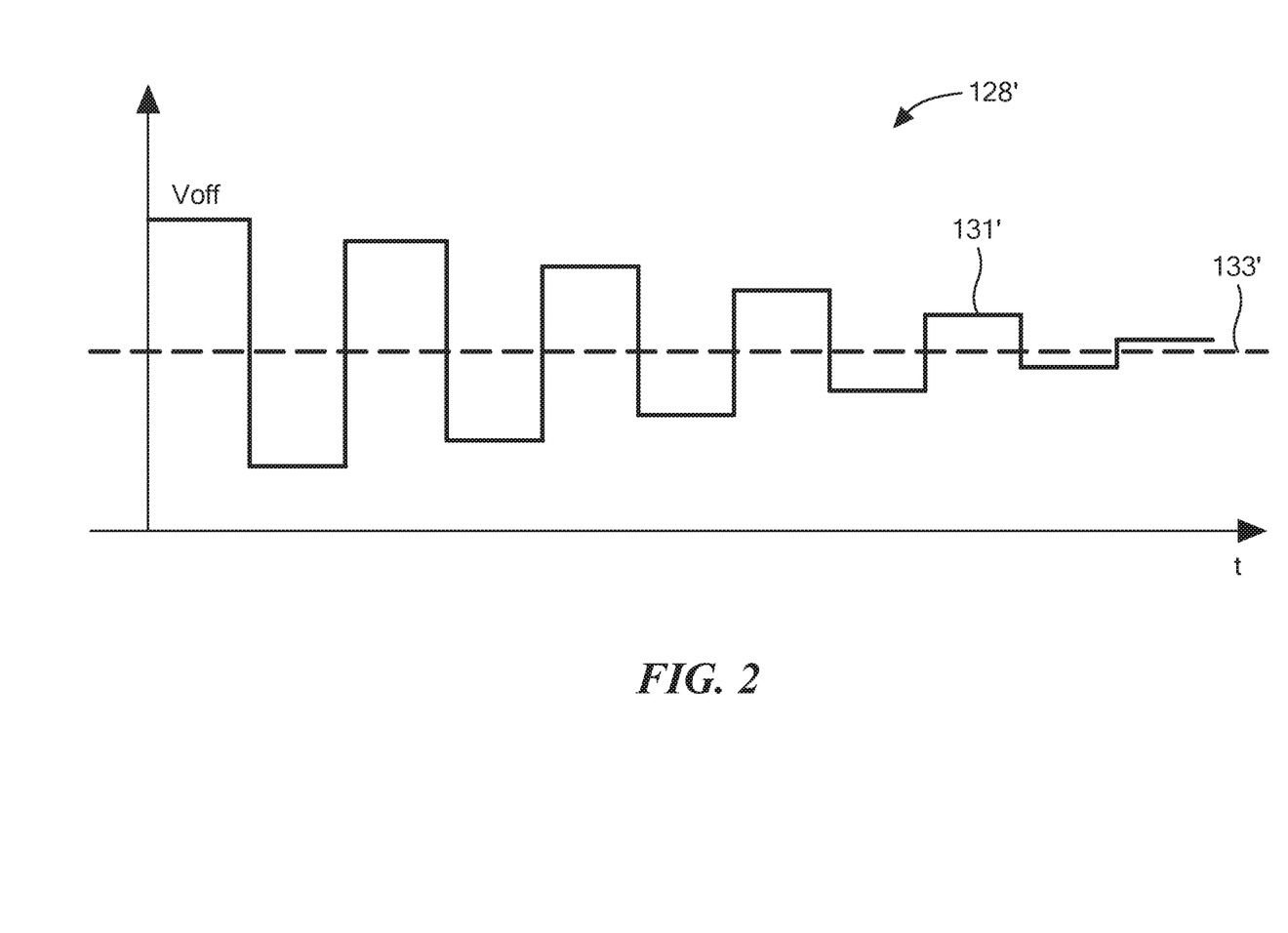
FIG. 2 is a graph of an example of a timing diagram.

Referring also to FIG. 2, an example of the chopper-stabilized amplifier output signal 128 is shown as signal 128' in which the horizontal axis has a scale in arbitrary units of time and the vertical axis has a scale in arbitrary units of volts. Signal 128' includes a ripple component, or ripple signal 131' and a sensed component, or sensed signal 133' corresponding to the sensed magnetic field. The frequency of the ripple signal 131' corresponds to the chopping frequency Fchop. As is apparent, after several chopping cycles, the offset signal 131' has been significantly attenuated as is desired.

Figure 3:
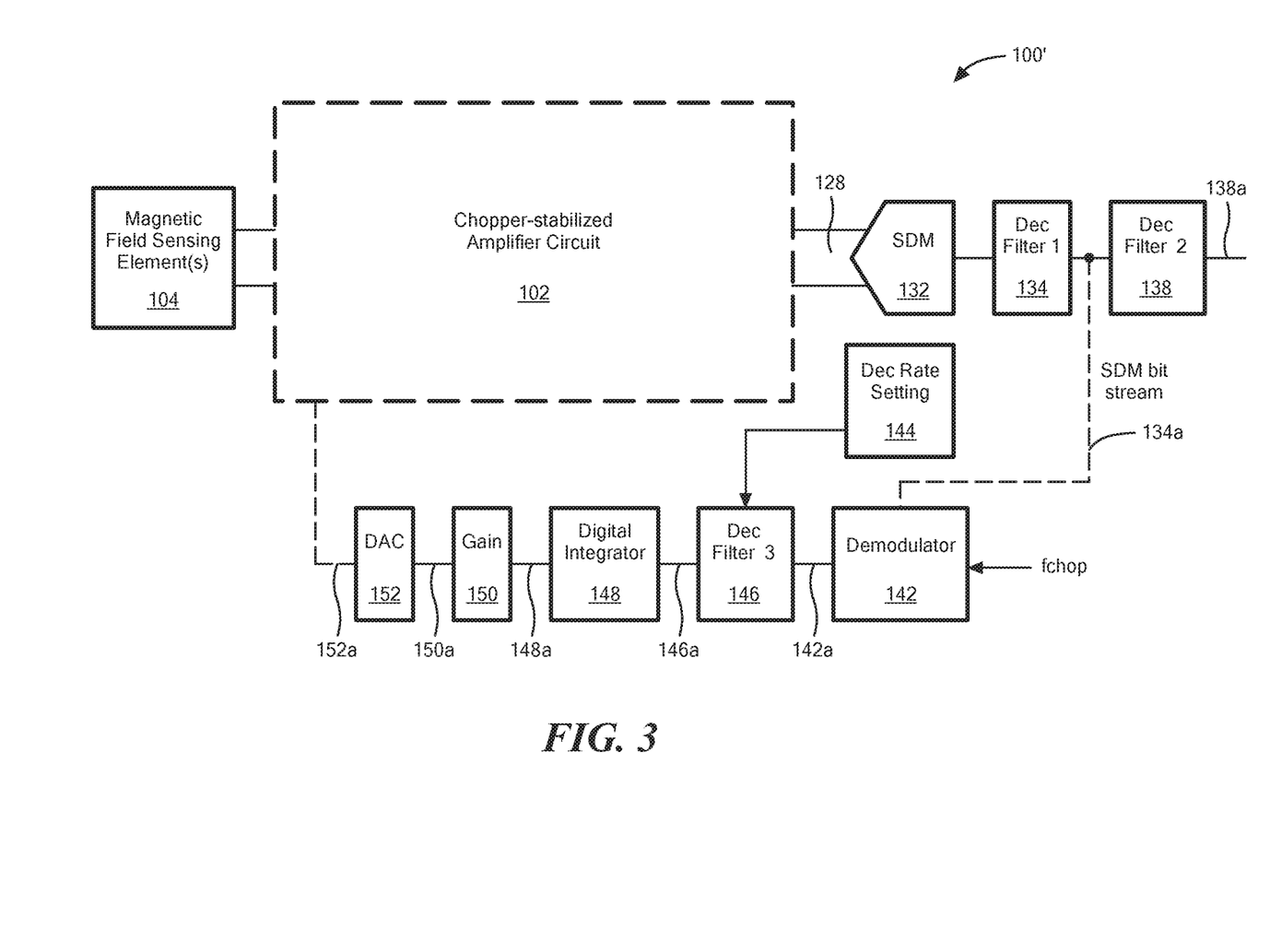
FIG. 3 is a block diagram of another example of a circuit to reduce ripple from chopper stabilization.

Referring to FIG. 3, an alternative sensor 100', including circuits and techniques to reduce a ripple component of a signal generated by chopper stabilization, includes chopper-stabilized amplifier circuit 102 responsive to one or more signals from a magnetic field sensing element 104, SDM 132 coupled to receive output signal 128 of the chopper-stabilized amplifier circuit 102, and a first decimation filter 134 coupled to an output of the SDM 132. Sensor 100' also includes a feedback loop, or ripple reduction loop (RRL) that includes demodulator 142 coupled to receive an output signal 134a of the first decimation filter 134, digital integrator 148, and DAC 152 to provide an analog compensation signal 152 to the chopper-stabilized amplifier 102. Thus, in this configuration, the feedback loop is closed around the first decimation filter 134, as shown. The decimation rate of the first decimation filter 134 can be equal to twice the chopping frequency Fchop in order to thereby minimize aliasing. In other embodiments, decimation filter 134 is not used to reduce ripple due to chopping. Rather, the feedback loop portion of sensor 100' reduces ripple due to chopping.

A second decimation filter 138 can be coupled to an output of the first decimation filter as shown and provide at its output a signal 138a that can correspond to an output signal of the magnetic field sensor 100' and can be coupled to a processor (not shown) for further processing depending on the sensor application. Second decimation filter 138 can include at least one notch filter to reduce the ripple.

The ripple reduction feedback loop in FIG. 3 can include a third decimation filter 146 coupled to an output of demodulator 142. In embodiments, decimation filter 146 can have a variable decimation rate selected to adjust the exponential decay of the ripple as may be controlled by a decimation rate controller 144. For example, the decimation rate can be optimized to be fast enough to provide precise filtering, but slow enough to reduce noise. More particularly, if the decimation rate is small (i.e. higher bandwidth) there will be less filtering, thus more noise is allowed through, but the ripple exponential decay time is minimized. On the contrary, high decimation rates improve filtering and noise reduction at the expense of longer exponential decays.

An output signal 146a of the third decimation filter 146 is coupled to digital integrator 148, the output of which provides a digital compensation signal 148a that is representative of the chopped offset.

A gain module 150 can be coupled to receive the output signal 148a of the integrator 148 in order to permit the gain of the chopped offset signal 148a (i.e., the loop gain) to be adjusted in order to thereby adjust the residual ripple level.

The gain adjusted compensation signal 150a is converted to an analog compensation signal 152a for further coupling to the chopper-stabilized amplifier circuit 102. Analog compensation signal 152a can be a current signal as described above in connection with signal 152a of FIG. 1, in which case DAC 152 can be a current steering DAC and signal 152a can be a current signal subtracted from the main signal path of the amplifier 102.

Figure 4:
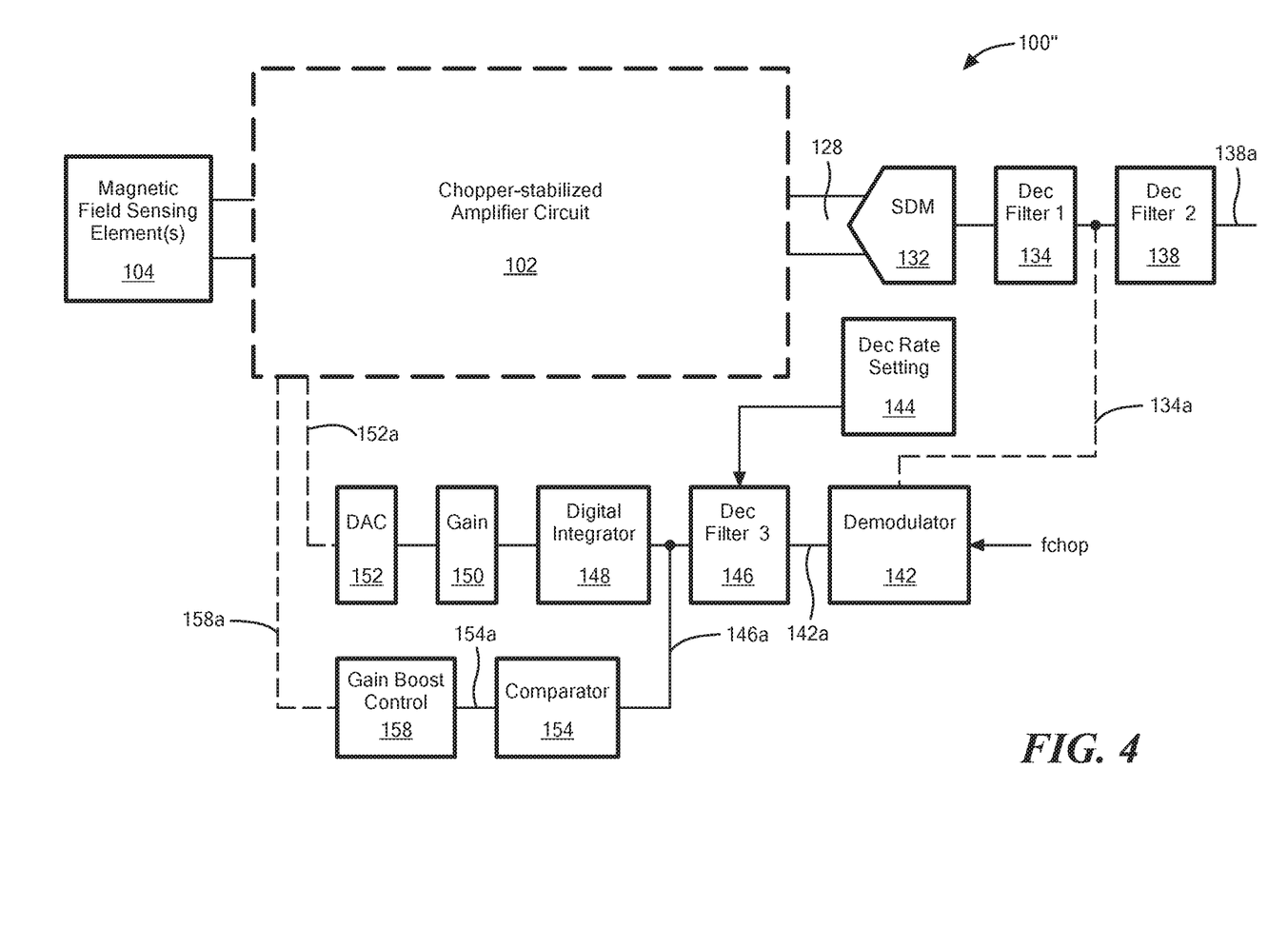
FIG. 4 is a block diagram of a further example of a circuit to reduce ripple from chopper stabilization.

Referring to FIG. 4, in which like reference characters refer to like elements, a further alternative sensor 100", including circuits and techniques to reduce a ripple component of a signal generated by chopper stabilization, includes the same elements as FIG. 3. The sensor 100" of FIG. 4 additionally includes a gain control loop.

More particularly, the output signal 146a of the third decimation filter 146 is coupled to an input of a comparator 154. Comparator 154 can be configured to compare the filter output signal 146a with a value of zero in order to determine when the ripple component has been eliminated (i.e., has been reduced to zero). It will be appreciated however, that the comparator 154 can alternatively compare the filter output signal 146a to a non-zero value if a non-zero ripple is acceptable.

A gain boost control circuit 158 can be coupled to receive an output signal 154a of the comparator 154 and can be configured to increase a gain of the chopper-stabilized amplifier 102 in response to a transition of the comparator output signal 154a (i.e., in response to an indication that the ripple signal has been canceled). More particularly, output signal 158a of the gain boost control circuit 158 can be coupled to various amplifiers of the chopper stabilized amplifier circuit 102 in order to thereby boost the loop gain once the ripple has been reduced to zero or at least to a sufficiently low level. Boosting the gain of the amplifier 102 can improve the signal to noise ratio of the SDM 132.

Various sensor application, such as automotive applications, require that the sensor perform a self-test. These applications often require rigorous safety standards. Injecting a test signal into sensor 100 and using the feedback loop to remove the test signal can provide test coverage without the addition of expensive circuitry or circuitry that may require a large amount of silicon area.

Figure 5:
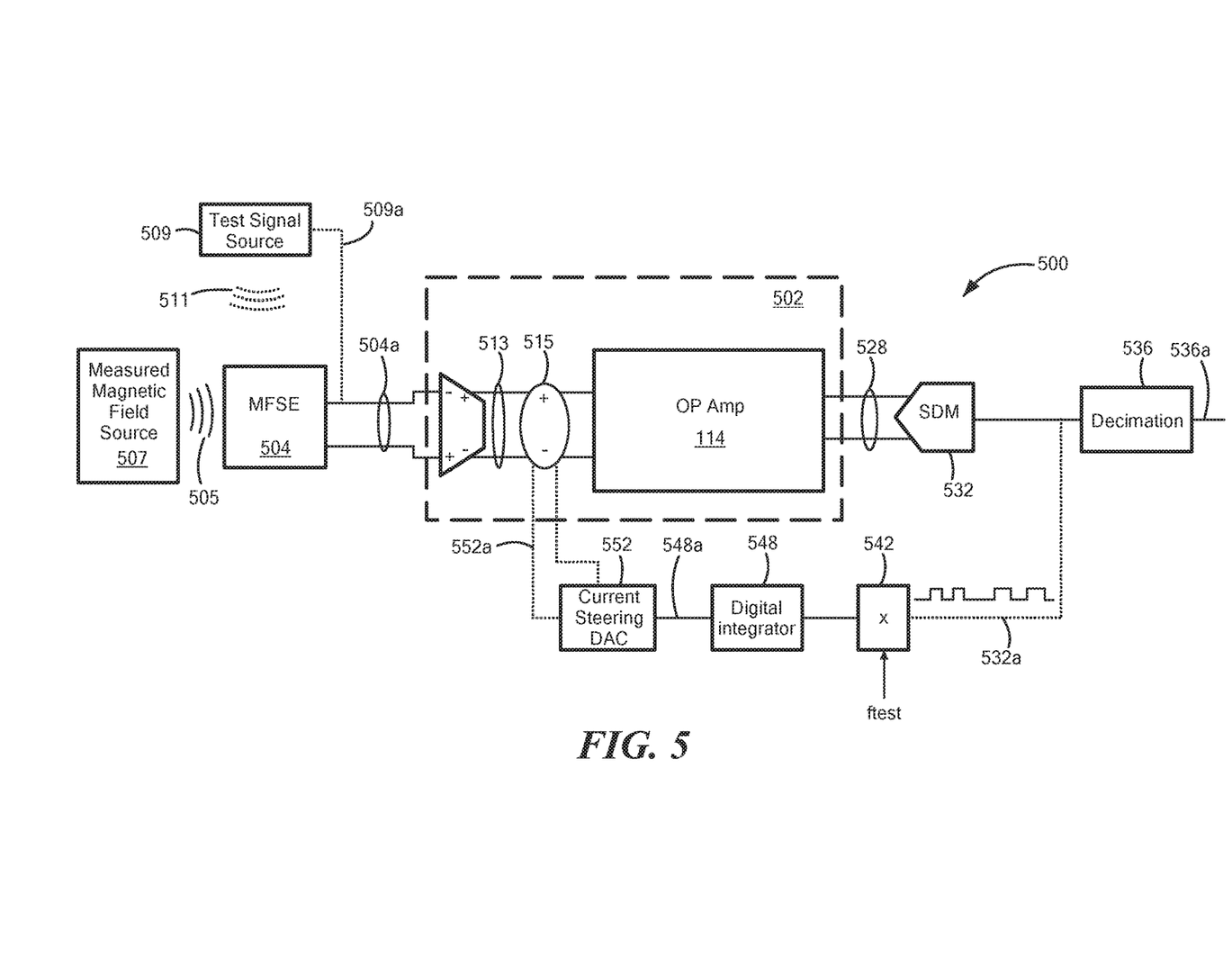
FIG. 5 is a block diagram of a circuit including a test signal generator and feedback path to process the test signal.

FIG. 5 is a block diagram of a sensor 500 that may perform a self-test. Sensor 500 may be similar to sensor 100 described above. Sensor 500 includes a chopper-stabilized amplifier circuit 502 responsive to one or more signals from a magnetic field sensing element 504, a sigma-delta modulator (SDM) 532 coupled to the chopper-stabilized amplifier circuit 502, and a decimation circuit 536 coupled to SDM 532. Sensor 500 also includes a feedback loop that includes a demodulator 542 coupled to an output of the SDM 532, a digital integrator 548 coupled to the demodulator 542, and a digital-to-analog converter (DAC) 552 coupled to an output of the digital integrator 548. Although sensor 500 is depicted with a chopper-stabilized amplifier circuit 502, amplifier 502 may be any type of amplifier in this embodiment. In embodiments where the feedback loop functions to remove and replicate an injected test signal, it may be acceptable for amplifier 502 to be a non-chopper-stabilized amplifier.

Magnetic field sensing elements 504 may be configured to detect measured magnetic field 505 produced by magnetic source 507 and produce signal 504a representing the detected magnetic field.

In embodiments, a test signal source 509 may generate a test signal and inject the test signal into the signal path of sensor 500. Test signal source 509 may include a coil or other magnetic source that generates a test magnetic field 511. Magnetic field sensing elements 504 may detect test magnetic field 511 so that at least a portion of signal 504a generated by magnetic field sensing elements 504 represents test magnetic field 511. In other embodiments, test signal source 509 may inject test signal 509a directly into output signal 504a. In this case, sensor 500 may include a summing circuit (not shown) that sums signals 509a and 504a before they are received by chopper-stabilized amplifier circuit 502.

A notch filter may be provided in the signal path of sensor 500. Generally, the notch may be provided in the signal transfer function of the feedback path of sensor 500. In an embodiment, the notch may be a function of integrator 548 and demodulator 542. More particularly, the notch may be provided by demodulating the output of the SDM with demodulator 542 and digitally integrating the result with digital integrator 548. Demodulator 542 may demodulate the signal by inverting the bit stream 532a according to the test signal frequency Ftest. This may avoid analog demodulation issues associated to parasitic capacitances and loading effects.

Integration by integrator 548 in the digital domain can be more desirable than conventional arrangements in which analog integration is performed, since analog integrators tend to require large capacitors for achieving large time constants and thus, tend to be costly in terms of area and other errors (like parasitic capacitance in chopper switches or other noise). As a result, the integrated signal 548a generated by the integrator 548 can be held as long as necessary without need of constant refresh. For example, in some embodiments, the feedback loop does not need to be active all the time and can be activated from time to time. This can allow sensor 500 to perform a periodic self-test to maintain safety standards, while reducing power consumption by operating the feedback loop intermittently.

The digital compensation signal 548a at the output of integrator 548 may be a reproduction of the original test signal (e.g. signal 509a or magnetic field 511). The reproduced test signal may be converted back into an analog signal by DAC 552 and subtracted from signal 513 by summation circuit 515 prior to signal 513 being received by amplifier 502.

Converted test signal 552a may be subtracted from the main path in the form of a current. Accordingly, a current steering DAC 552 can be used. In an embodiment, a test signal reduction factor of 100× (which is sufficient to maximize the input dynamic range of the SDM 532) requires no more than 7-bit precision in the DAC 552.

In this way, the test signal will tend to vanish from the main signal over a few clock cycles, and therefore the SDM 532 will have virtually all of its input dynamic range available to digitize the sensed magnetic field signal (i.e., as opposed to having to process both the sensed signal and the test signal) and saturation of the SDM will be avoided by removing the test signal before the SDM (i.e., as opposed to relying on the decimation filter 536 to remove the test signal). In addition, the feedback loop may extract (e.g. demodulate) and reproduce the test signal from signal 532a, so that sensor 500 may perform a self-test.

In embodiments, magnetic field sensing elements 504 may be magnetoresistance elements. In other embodiments, magnetic field sensing elements 504 may be Hall effect elements and amplifier 502 may be a chopper-stabilized amplifier (like chopper stabilized amplifier 102).

The output signal 528 of amplifier circuit 502 is coupled to the SDM 532 which digitizes the signal 528. Decimation filter 536 is coupled to an output of the SDM 532 to filter the output signal. In embodiments, the decimation filter 536 has a notch at a frequency selected to further reduce the portion of signal 532a attributable to the test signal (i.e. test signal 509a or magnetic field 511). The notch characteristics may be a function of the feedback portion of the signal path in sensor 500.

In general, the feedback loop portion of sensor 500 may effectuate a closed loop transfer function that acts as a notch filter. The feedback loop includes integrator 548, which may act as a high-gain low-pass filter. Because integrator 548 is part of the feedback loop, its transfer function may be inverted so that it acts as a high-pass filter. Demodulator 542 may shift the low-frequency response of integrator 548 to the frequency Ftest. This may result in the feedback loop providing sensor 500 with a transfer function that includes an inverted notch (i.e. a notch filter) that attenuates the test signal from the main signal path after a few clock cycles.

An output signal 536a of the decimation filter 536 can correspond to an output signal of the magnetic field sensor 500 and can be coupled to a processor (not shown) for further processing depending on the sensor application. Accordingly, it is desirable that the sensor output signal 536a consist only of signal components directly related to the magnetic field 505 and not include undesirable signal components including test signal 509a (or 511).

As explained above, a feedback loop including demodulator 542, integrator 548, and DAC 552 is configured to reduce the portion of signal 513a attributable to the test signal. More particularly, the output signal 532a of the SDM 532 is demodulated by demodulator 542, as may be achieved by inverting the bit stream 532a according to the test signal frequency Ftest.

The demodulated signal 542a is integrated by digital integrator 548 to generate a digital compensation signal 548a that represents the test signal. The digital compensation signal 548a is coupled to DAC 552 for conversion to an analog test signal 552a, which is subtracted from signal 513.

The combination of demodulator 542 and integrator 548 may provide the signal path of sensor 500 with a transfer function that includes a notch filter, with the notch centered at frequency Ftest. This transfer function may attenuate the test signal from the main signal path (e.g. the output of sensor 500) after a few clock cycles.

Although DAC 552 is shown as a current steering DAC, other types of DACs may be used.

Figure 6:
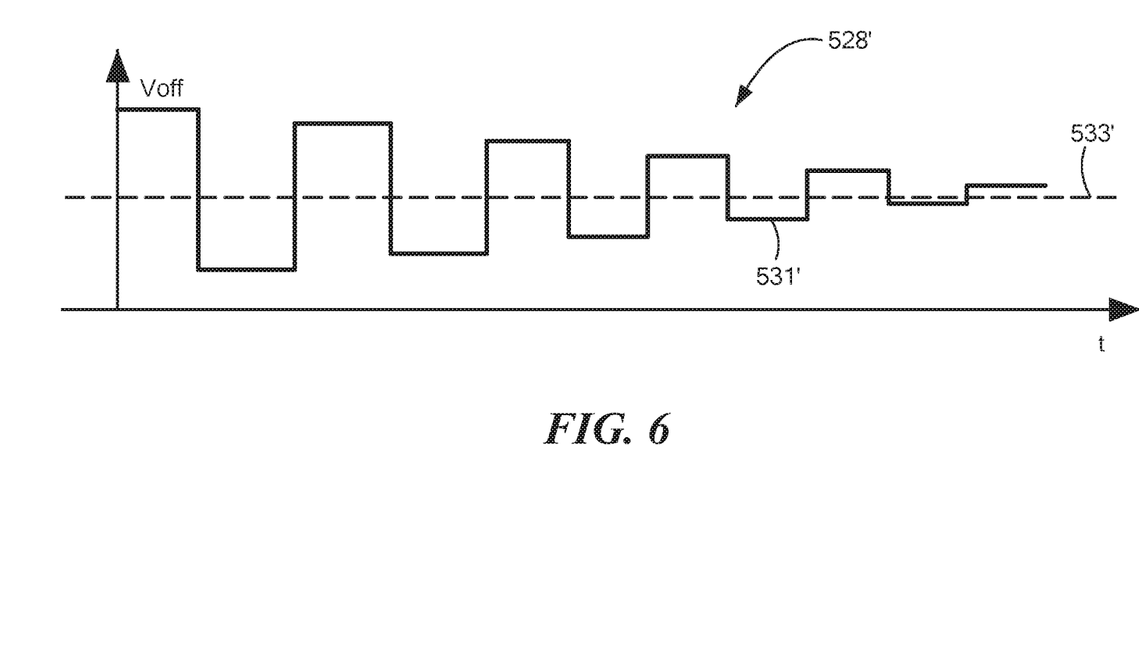
FIG. 6. is a graph of signals associated with the circuit of FIG. 5

Referring to FIG. 6, graph 600 illustrates reduction of the test signal from the main circuit path of sensor 500. The horizontal axis represents time and the vertical axis represents voltage. Signal 528 is shown as signal 528'. In this example, magnetic field 505 is a DC field. If the test signal were not injected into signal 528', signal 528' would follow dotted line 533', which represents the sensed magnetic field 505. However, injecting a square-wave test signal (e.g. signal 509a) results in signal 528' having a square wave component 531'. The frequency of square wave component 531' corresponds to the test signal frequency Ftest. As shown in FIG. 6, after several clock cycles, test signal component 531' attenuates due to the feedback loop and subtraction of the test signal by summation circuit 515. As test signal component 531' decays, signal 528' attenuates and approaches sensed magnetic field signal 533'. Thus, the feedback loop may act as a filter to remove the test signal from output signal 528' after a few clock cycles.

Figure 7:
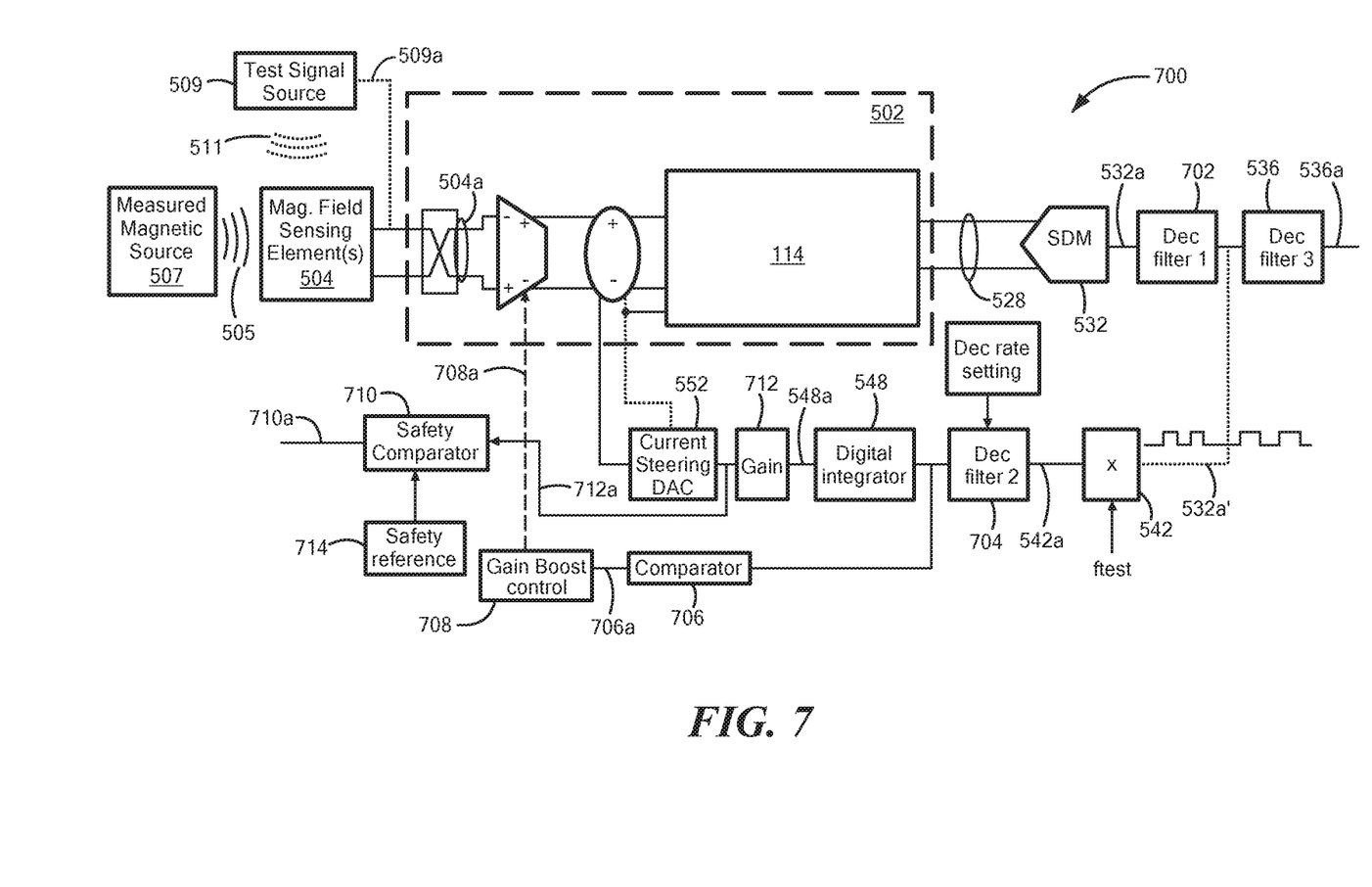
FIG. 7 is a block diagram of a circuit including a feedback loop to process and attenuate a test signal

FIG. 7 is a block diagram of a sensor circuit 700, which may be the same as or similar to sensor 500. Sensor circuit 700 includes an additional decimation filter 702 which may receive signal 532a as an input and generate signal 532a' as an output. Decimation filter 702 may remove undesirable signal components, such as noise, from signal 532a before signal 532a is sent to the feedback loop.

The feedback loop may include an additional decimation filter 704 coupled to receive modulated signal 542a from modulator 542. Decimation filter 704 may also remove undesirable signal components from signal 542a, such as noise introduced by modulator 542, for example. The feedback loop may also include a gain circuit 712, which may be an amplifier or other circuit coupled to receive signal 548a and provide an amplified output signal 712a. In embodiments, signal 712a may represent test signal 509a.

Comparator circuit 706 may receive signal 704a from decimation filter 704 and compare it to a predetermined value to determine when the ripple component has been eliminated (i.e., has been reduced to zero). In embodiments, the predetermined value may be zero. Alternatively, the predetermined value may be a non-zero value if it is acceptable that a non-zero signal component due to the test signal is acceptable.

A gain boost control circuit 708 can be coupled to receive an output signal 706a of comparator 706 and can be configured to increase a gain of amplifier 102 in response to a transition of the comparator output signal 706a (i.e., in response to an indication that the test signal component has been removed). More particularly, output signal 708a of the gain boost control circuit 708 can be coupled to various amplifiers of sensor 700 in order to boost the loop gain once the test signal component has been reduced to zero or at least to a sufficiently low level. Boosting the gain of the amplifier 102, for example, can improve the signal to noise ratio of the SDM 532.

Sensor 700 may also include a safety comparator circuit 710 coupled to receive the output 712a of gain circuit 712 and compare it to a safety reference signal 714. Safety reference signal 714 may be a predetermined threshold. If signal 712a falls outside the threshold (e.g. if signal 712a is greater than a maximum allowable value or less than a minimum allowable value), safety comparator circuit 710 may raise an error signal 710a indicating that a safety margin has been exceeded and/or that sensor 700 is not operating as expected.

As noted above, signal 712a may represent the original test signal 509a (or test magnetic field 511). In embodiments, signal 712a may be a replica of the original test signal

509a. In embodiments, if the test signal is an oscillating signal, signal 712a may be an oscillating signal centered about a predetermined value. Comparator circuit 710 may include peak detectors, frequency counters, and other circuits to determine if signal 712a has the same or similar characteristics as original test signal 509a. If signal 712a does not have the same or similar characteristics, then comparator circuit 710 may raise error signal 710a.

Figure 8:
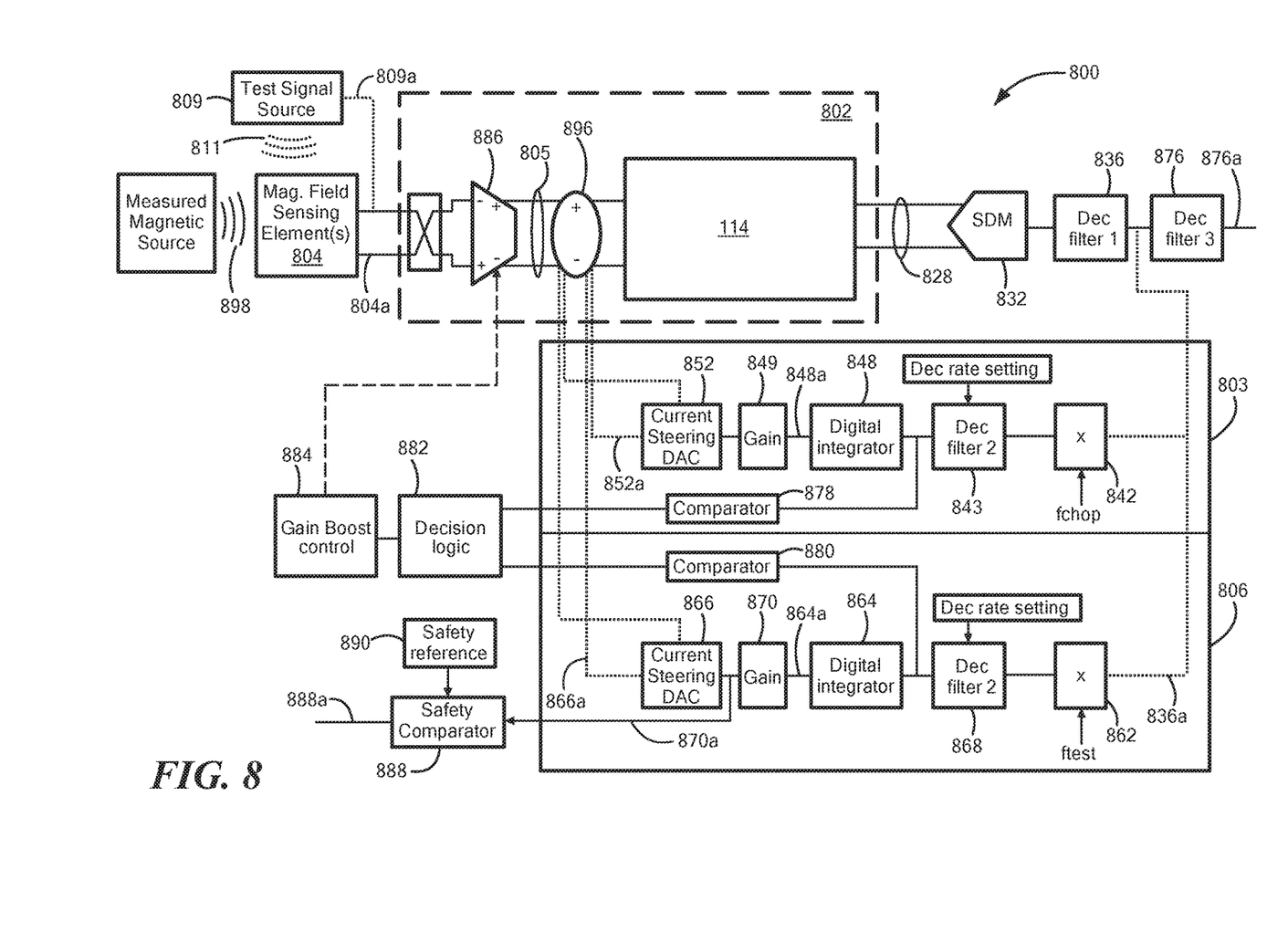
FIG. 8 is a block diagram of a circuit including a feedback loop to reduce ripple from chopper stabilization and a feedback loop to process and attenuate a test signal.

Referring to FIG. 8, sensor 800 may be similar to sensors 700 and/or 100. Sensor 800 may have two feedback loops: one feedback loop 803 to remove ripple introduced by a chopper-stabilized amplifier and another feedback loop 806 to remove and reproduce an injected test signal.

Sensor 800 includes a chopper-stabilized amplifier circuit 802, which may be the same as or similar to chopper-stabilized amplifier circuit 102 (see FIG. 1). Chopper-stabilized amplifier circuit 802 may be responsive to one or more signals from a magnetic field sensing element 804. Sensor 800 also includes a sigma-delta modulator (SDM) 832 coupled to the chopper-stabilized amplifier circuit 802, and a decimation circuit 836 coupled to SDM 832 to remove noise and other undesirable signal components.

A test signal source 809 may generate a test signal and inject the test signal into the signal path of sensor 800. Test signal source 809 may include a coil or other magnetic source that generates a test magnetic field 811. Magnetic field sensing elements 804 may detect test magnetic field 811 so that at least a portion of signal 804a generated by magnetic field sensing elements 804 represents test magnetic field 811. Additionally or alternatively, test signal source 809 may inject test signal 809a directly into output signal 804a. In this case, sensor 800 may include a summing circuit (not shown) that sums signals 809a and 804a before they are received by chopper-stabilized amplifier circuit 802.

Sensor 800 also includes a feedback loop, or ripple reduction feedback loop (RRL) 803 that includes a demodulator 842 coupled to an output of decimation circuit 836. Demodulator 842 may operate at a frequency that is the same as the chopping frequency of chopper-stabilized amplifier 802. Ripple reduction feedback loop 803 also includes a digital integrator 848, and a digital-to-analog converter (DAC) 852 coupled to an output of the digital integrator 848 and to the chopper-stabilized amplifier 802. Feedback loop 803 may also include a decimation filter 843 (between demodulator 842 and digital integrator 848) to remove noise (e.g. noise introduced by modulator circuit 842) and a gain circuit 849 (between digital integrator circuit 848 and DAC 852) to amplify the signal.

Sensor 800 also includes a second feedback loop 806 to process and remove test signal 809a (or a signal due to test magnetic field 811) from the main signal path. Test signal feedback loop 806 includes a demodulator 862 coupled to an output of decimation circuit 836. Demodulator 862 may operate at a frequency that is the same as the frequency of test signal 809a (or magnetic field 811). Test signal feedback loop 806 also includes a digital integrator 864 and a digital-to-analog converter (DAC) 866 coupled to an output of the digital integrator 864 and to the chopper-stabilized amplifier 802. Test signal feedback loop 806 may also include a decimation filter 868 (between demodulator 862 and digital integrator 864) to remove noise (e.g. noise introduced by modulator circuit 862) and a gain circuit 870 (between digital integrator 864 and DAC 866) to amplify the signal.

A notch is provided in the signal transfer function of the forward signal path of sensor 800. Two notches may be provided, one at frequency Fchop and one at frequency Ftest. In general, the notches at frequency Fchop may be provided by feedback loop 803 and the notch at Ftest may be provided by feedback loop 806. Feedback loop 803 includes integrator 848, which may act as a high-gain low-pass filter. Because integrator 848 is part of a feedback loop, its transfer function may be inverted so that it acts as a high-pass filter. Demodulator 842 may shift the low-frequency response of integrator 848 to the frequency Fchop. This may result in the feedback loop 803 providing sensor 800 with a transfer function that includes an inverted notch (i.e. a notch filter) that attenuates the ripple due to the chopping circuit from the main signal path after a few clock cycles.

Feedback loop 806 includes integrator 864, which may act as a high-gain low-pass filter. Because integrator 864 is part of the feedback loop, its transfer function may be inverted so that it acts as a high-pass filter. Demodulator 862 may shift the low-frequency response of integrator 864 to the frequency Ftest. This may result in feedback loop 806 providing sensor 800 with a transfer function that includes an inverted notch (i.e. a notch filter) that attenuates the test signal from the main signal path after a few clock cycles.

Integration by integrator 848 and 864 in the digital domain can be more desirable than conventional arrangements in which analog integration is performed, since analog integrators tend to require large capacitors for achieving large time constants and thus, tend to be costly in terms of area and other errors (like parasitic capacitance in chopper switches) which errors can adversely impact performance of the loop. In some embodiments, the feedback loops 803 and 806 do not need to be active all the time and can be activated from time to time only (e.g. feedback loop 802 can be activated only if a certain delta temperature occurs which might generate some offset (and therefore) ripple drift and/or feedback loop 806 can be activated only if a self-test is being performed).

The digital compensation signal 848a at the output of integrator 848 is representative of the chopped offset, which is converted back to the analog domain by DAC 852 and subtracted from the chopped magnetic field signal by a summation element 834 in the amplifier circuit 802. Similarly, the digital compensation signal 864a is representative of test signal 809a, which is converted back to the analog domain by DAC 866. The outputs of these DACs, signals 852a and 866a, are subtracted from the main path by summation circuit 872. In embodiments, the signals are subtracted in the form of current. Thus, DACs 852 and 866 may be current steering DACs.

In this way, the ripple due to the chopper-stabilized amplifier 802 will tend to vanish over a few chopper clock cycles and the test signal portion of signal 805 will tend to vanish over a few test signal clock cycles. Therefore, the SDM 832 will have virtually all of its input dynamic range available to digitize the sensed magnetic field signal (i.e., as opposed to having to process the sensed signal, the chopper generated ripple, and the test signal, which reduces the available input dynamic range) and saturation of the SDM will be avoided by removing ripple and test signal before the SDM.

Chopper-stabilized amplifier 802 may be the same as or similar to chopper-stabilized amplifier 102 (see FIG. 1). Like chopper-stabilized amplifier 102, chopper-stabilized amplifier 802 includes a switch, or modulator that modulates the signal received from a magnetic field sensing element 804 at a chopping frequency Fchop, an amplifier that receives a modulated signal from the switch, and an op amp that receives the output from the amplifier. An output signal of the op amp 814 is an output signal 828 of the chopper-stabilized amplifier circuit 802.

The output signal 828 of the chopper-stabilized amplifier circuit 802 is coupled to the SDM 832 which digitizes the signal 828. Decimation filter 836 is coupled to an output of the SDM 832 to filter the output signal to filter noise.

An output signal 876*a* of the decimation filter 876 can correspond to an output signal of the magnetic field sensor 800 and can be coupled to a processor (not shown) for further processing depending on the sensor application. Accordingly, it is desirable that the sensor output signal 876*a* consist only of signal components directly related to the magnetic field which the Hall Effect element 804 senses and not include signal components including ripple or test signal 809*a*.

Feedback loop 803 may include a comparator circuit 878 configured to compare the output of decimation filter 843 with a zero value to determine if the ripple caused by the chopping operation has been removed from the signal. Comparator circuit 878 may compare the output of decimation filter 843 with a non-zero value if a non-zero value is acceptable. Similarly, feedback loop 806 may include a comparator circuit 880 configured to compare the output of decimation filter 868 with a zero value to determine if the ripple caused by the chopping operation has been removed from the signal. Comparator circuit 880 may compare the output of decimation filter 868 with a non-zero value if a non-zero value is acceptable.

The outputs (i.e. signals 878*a* and 880*a*) of comparator circuits 878 and 880 may be coupled to decision logic circuit 882. If comparator circuit 878 and 880 indicate that the chopper ripple and test signal components have been removed, then decision logic circuit may activate gain boost control circuit 884. Gain boost control circuit 884 may, in turn, boost the gain of amplifier 886 in the main signal path to increase the signal-to-noise ratio of sensor 800.

Sensor 800 may also include a safety comparator circuit 888 coupled to receive the output 870*a* of gain circuit 870 and compare it to a safety reference signal 890. Safety reference signal 890 may be a predetermined threshold. If signal 870*a* falls outside the threshold (e.g. if signal 870*a* is greater than a maximum allowable value or less than a minimum allowable value), safety comparator circuit 888 may raise an error signal 888*a* indicating that a safety margin has been exceeded and/or that sensor 800 is not operating as expected.

Signal 870*a* may represent the original test signal 809*a* (or test magnetic field 811). In embodiments, signal 870*a* may be a replica of the original test signal 809*a*. If the test signal is an oscillating signal, signal 870*a* may be an oscillating signal centered about a predetermined value. Comparator circuit 888 may include peak detectors, frequency counters, and other circuits to determine if signal 870*a* has the same or similar characteristics as original test signal 809*a*. If signal 870*a* does not have the same or similar characteristics, then comparator circuit 888 may raise error signal 888*a*.

Figure 9:
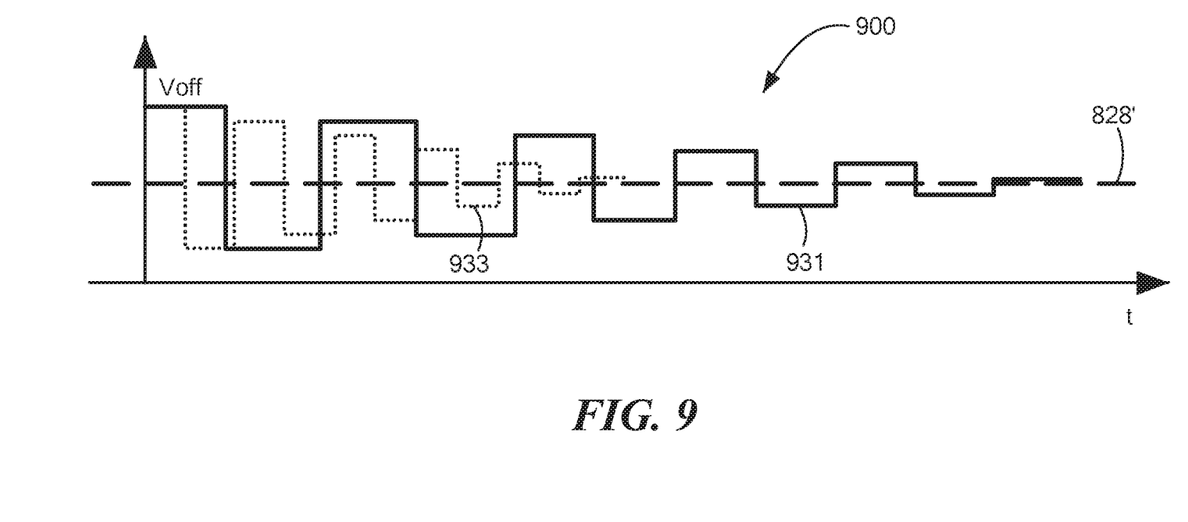
FIG. 9 is a graph of signals associated with the circuit of FIG. 8.

Referring also to FIG. 9, graph 900 illustrates reduction of the test signal and ripple from the main circuit path of sensor 800. The horizontal axis represents time and the vertical axis represents voltage. Signal 828 is shown as signal 828'. In this example, magnetic field 898 is a DC field. If the test signal were not injected into signal 828, and if there were no ripple present from chopper-stabilized amplifier 802, signal 828 would follow dotted line 828', which represents the sensed magnetic field 898. However, injecting a square-wave test signal (e.g. signal 809*a*) results in signal 828' having a square wave component 931. The frequency of square wave component 931 corresponds to the test signal frequency Ftest. As shown in FIG. 9, after several clock cycles, test signal component 931 attenuates due to the feedback loop 806 and subtraction of the test signal by summation circuit 896. As test signal component 931 decays, signal 828' attenuates. Thus, the feedback loop 806 may act as a filter to remove the test signal from output signal 828' after a few clock cycles.

The signal may also include a ripple component 933. The frequency of ripple component 933 corresponds to the chopping frequency Fchop of chopper-stabilized amplifier 802. As shown in FIG. 9, after several clock cycles, ripple component 933 attenuates due to the feedback loop 803 and subtraction of the test signal by summation circuit 896. Thus, the feedback loop 803 may act as a filter to remove the ripple component from output signal 828' after a few clock cycles.

Having described preferred embodiments, it will now become apparent to one of ordinary skill in the art that other embodiments incorporating their concepts may be used. Elements of different embodiments described herein may be combined to form other embodiments not specifically set forth above. Various elements, which are described in the context of a single embodiment, may also be provided separately or in any suitable subcombination. Other embodiments not specifically described herein are also within the scope of the following claims.

The invention claimed is:

1. A sensor circuit comprising:
   at least one magnetic field sensing element to generate a magnetic field signal representing a magnetic field to be measured;
   a test signal generator circuit configured to generate a test signal and combine the test signal with the magnetic field signal to generate a combined signal;
   a signal path for processing the combined signal, the signal path comprising:
      an amplifier circuit to amplify the combined signal;
      an analog-to-digital converter (ADC) to convert the combined signal to a digital combined signal;
      a feedback circuit coupled to receive the digital signal and extract the test signal; and
   a test comparator circuit to compare the extracted test signal to a reference signal.

2. The sensor circuit of claim 1 wherein the amplifier circuit is a chopper-stabilized amplifier circuit configured to receive and amplify the combined signal.

3. The sensor circuit of claim 1 wherein the (ADC) comprises a sigma-delta modulator (SDM).

4. The sensor circuit of claim 1 wherein the feedback circuit comprises a demodulator circuit to extract the test signal from the digital combined signal by inverting a bit stream of the digital combined signal from the ADC according to a test signal frequency rate.

5. The sensor circuit of claim 1 wherein the feedback circuit comprises a feedback circuit amplifier to amplify the extracted test signal.

6. The sensor signal of claim 5 wherein the feedback amplifier circuit amplifies the extracted test signal.

7. The sensor circuit of claim 1 wherein the feedback circuit comprises a digital-to-analog converter (DAC) to convert the extracted test signal to an analog extracted test signal.

8. The sensor circuit of claim 7 wherein the DAC is coupled to the signal path to feed the extracted test signal back into the signal path to reduce an amplitude of a portion of the digital combined signal attributed to the test signal.

9. The sensor circuit of claim 7 wherein the DAC is a current-steering DAC.

10. The sensor circuit of claim 1 wherein the feedback circuit comprises a digital integrator to integrate the test signal.

11. The sensor circuit of claim 2 wherein the signal path further comprises a second feedback circuit configured to reduce a ripple in a signal generated by the amplifier circuit.

12. The sensor circuit of claim 1 wherein the comparator circuit generates an error if the value of the extracted test signal falls outside a predetermined threshold.

13. The sensor circuit of claim 11 wherein the second feedback circuit comprises:
- a demodulator to demodulate a signal from the ADC in a digital domain by inverting a bit stream of the signal from the ADC according to a frequency chopping rate;
- a digital integrator configured to integrate an output signal of the demodulator to form an integrated signal; and
- a digital-to-analog converter (DAC) configured to convert the integrated signal to an analog signal and provide the analog signal to the chopper-stabilized amplifier circuit.

14. The sensor circuit of claim 1 further comprising a decimation filter coupled to an output of the ADC, wherein the feedback circuit is coupled to an output of the decimation filter, and wherein the decimation filter comprises at least one notch filter to reduce an amplitude of a portion of the digital combined signal attributed to noise.

15. The sensor circuit of claim 14 wherein the first decimation filter uses a first decimation rate with a frequency that is twice the frequency of the test signal or higher.

16. The sensor circuit of claim 14 further comprising a second decimation filter coupled to an output of the first decimation filter.

17. The sensor circuit of claim 16, wherein the second decimation filter is configured to adjust a bandwidth of a forward signal path of the sensor circuit.

18. The sensor circuit of claim 1 wherein the feedback circuit comprises a decimation filter coupled to filter noise and pass the extracted test signal.

19. The sensor circuit of claim 1 wherein the reference signal has an amplitude of about zero.

20. The sensor circuit of claim 2, wherein the chopper-stabilized amplifier circuit comprises:
- a first switch to receive signals from the at least one magnetic sensing element;
- a first amplifier configured to receive signals from the first switch;
- a second switch configured to receive signals from the first amplifier;
- a second amplifier configured to receive signals from the second switch;
- a third switch configured to receive signals from the second amplifier; and
- a third amplifier configured to receive signals from the third switch.

21. The sensor circuit of claim 1 wherein the at least one magnetic sensing element comprises at least one of: a Hall effect element, a magnetoresistance element, or a magnetotransistor.

22. The sensor circuit of claim 21 wherein the at least one Hall effect element comprises one or more of a planar Hall element, a vertical Hall element or a Circular Vertical Hall (CVH) element.

23. The sensor circuit of claim 21 wherein the magnetoresistive element is chosen from the list consisting of: a giant magnetoresistance (GMR) element, an anisotropic magnetoresistance element (AMR), a tunneling magnetoresistance (TMR) element, and a magnetic tunnel junction (MTJ).

* * * * *

UNITED STATES PATENT AND TRADEMARK OFFICE
CERTIFICATE OF CORRECTION

PATENT NO. : 10,481,219 B2
APPLICATION NO. : 15/897708
DATED : November 19, 2019
INVENTOR(S) : Hernán D. Romero et al.

Page 1 of 1

It is certified that error appears in the above-identified patent and that said Letters Patent is hereby corrected as shown below:

In the Specification

Column 2, Line 65 delete "FIG. 5" and replace with --FIG. 5.--.

Column 2, Line 67 delete "signal" and replace with --signal.--.

Column 7, Line 55 delete "application" and replace with --applications--.

Column 13, Line 33 delete "decision logic circuit" and replace with --decision logic circuit 882--.

Signed and Sealed this
Fifteenth Day of September, 2020

Andrei Iancu
*Director of the United States Patent and Trademark Office*